(12) United States Patent
McNeilly et al.

(10) Patent No.: US 8,867,867 B2
(45) Date of Patent: Oct. 21, 2014

(54) FIBER OPTIC SWITCH

(71) Applicant: The Cleveland Electric Laboratories Company, Twinsburg, OH (US)

(72) Inventors: Mike McNeilly, Gilbert, AZ (US); Scott V. Johnson, Scottsdale, AZ (US)

(73) Assignee: The Cleveland Electric Laboratories Company, Twinsburg, OH (US)

( * ) Notice: Subject to any disclaimer, the term of this patent is extended or adjusted under 35 U.S.C. 154(b) by 0 days.

(21) Appl. No.: 13/915,981

(22) Filed: Jun. 12, 2013

(65) Prior Publication Data

US 2013/0330032 A1    Dec. 12, 2013

Related U.S. Application Data

(60) Provisional application No. 61/658,446, filed on Jun. 12, 2012.

(51) Int. Cl.
*G02B 6/35* (2006.01)

(52) U.S. Cl.
CPC .................................. *G02B 6/3564* (2013.01)

USPC .............................................. 385/13; 385/16

(58) Field of Classification Search
USPC .......................................... 385/12–13, 14–16
See application file for complete search history.

(56) References Cited

U.S. PATENT DOCUMENTS

| 3,704,965 | A | * | 12/1972 | Mentschel et al. ............ 417/395 |
| 5,594,819 | A | * | 1/1997 | Narendran et al. ............. 385/12 |
| 5,945,666 | A | * | 8/1999 | Kersey et al. ............ 250/227.14 |
| 6,208,776 | B1 | * | 3/2001 | Prohaska et al. ................ 385/13 |
| 7,002,672 | B2 | * | 2/2006 | Tsuda .......................... 356/73.1 |

* cited by examiner

*Primary Examiner* — Akm Enayet Ullah
(74) *Attorney, Agent, or Firm* — Emerson Thomson Bennett, LLC; Roger D. Emerson; Sergey Vernyuk

(57) ABSTRACT

This disclosure is of a fiber optic switch, where an actuated plunger causes a snap-action mechanism to change rapidly from a first state to a second state and place a loaded member from a first strain condition into a second strain condition where the two conditions are substantially different. A strain sensor mounted on the loaded member senses the strain of the loaded member and transmits a corresponding signal on a fiber optic cable.

20 Claims, 5 Drawing Sheets

FIBER OPTIC SWITCH

I. BACKGROUND OF THE INVENTION

A. Field of Invention

This invention pertains to the art of fiber optics, and more specifically to fiber optic switches.

B. Description of the Related Art

It is known in the art to use electromagnetic switches to determine whether doors or panels are open or closed. On-off electromagnetic switches are also used as proximity or limit switches.

It is also known to use a fiber light pipe as an on/off switch. A light beam shines from a transmitter and is received by a receiver. If the receiver receives the beam, the switch is in one state, for example "on." If the light beam is broken, the switch is in another state, for example "off." However, because the light break occurs outside the fiber, the distance of such a switch is limited.

Also known is a measurement device that includes a fastener for use in attaching a first member to a second member, in which the fastener has an aperture extending through a length of the fastener, and a first optical fiber located within the aperture, in which the first optical fiber includes at least one fiber Bragg grating sensor. Such a device is described in U.S. Patent Pub. 2010/0329602, published on Dec. 30, 2010, entitled SMART FASTENER AND SMART INSERT FOR A FASTENER USING FIBER BRAGG GRATINGS TO MEASURE STRAIN AND TEMPERATURE (Shah, Chandler, Madsen, and Way), which is incorporated herein by reference.

Also known is a sensor apparatus that includes a resilient member positioned near a rod member and a strain sensor operatively connected to the resilient member. The rod member includes an eccentric member, which causes the resilient member to deflect as the rod member rotates. The strain sensor measures the strain in the resilient member due to the deflections caused by the eccentric member. The amount of strain relates to a rotational position of the rod member. Such an apparatus is described in U.S. Patent Pub. 2011/0011188, published Jan. 20, 2011, entitled FIBER OPTIC ROTATION/POSITION SENSOR (McNeilly), which is incorporated herein by reference.

What is needed, however, is an intrinsically-safe switch that can be used in hazardous environments and that can be located at a considerable distance from the equipment that receives the switch's signal. The present invention addresses this need.

II. SUMMARY

In accordance with one aspect of the present invention, a fiber optic switch includes a plunger; a loaded member; a strain sensor mounted on the loaded member to sense strain applied to the loaded member; a snap-action mechanism connected between the plunger and the loaded member, wherein when the plunger is deactuated, the snap-action mechanism is in a first state; wherein actuation of the plunger causes the snap-action mechanism to change rapidly from the first state to a second state; wherein deactuation of the plunger causes the snap-action mechanism to change rapidly from the second state to the first state; and wherein the first state is substantially different from the second state; and a housing enclosing the loaded member, strain sensor, snap-action mechanism, and a substantial part of the plunger when the plunger is actuated; wherein the snap-action mechanism puts the loaded member into a first condition when the snap-action mechanism is in the first state, and into a second condition when the snap-action mechanism is in the second state; and wherein the strain sensed by the strain sensor when the loaded member is in the first condition is substantially different from the strain sensed by the strain sensor when the loaded member is in the second condition.

In accordance with another aspect of the present invention, a system for sensing actuation includes at least one fiber optic switch, including a plunger; a loaded member made of a resilient material; a strain sensor mounted on the loaded member to sense strain applied to the loaded member; a snap-action mechanism connected between the plunger and the loaded member, wherein when the plunger is deactuated, the snap-action mechanism is in a first state; wherein actuation of the plunger causes the snap-action mechanism to change rapidly from the first state to a second state; wherein deactuation of the plunger causes the snap-action mechanism to change rapidly from the second state to the first state; and wherein the first state is substantially different from the second state; a fiber optic cable connected to the strain sensor; a vertical spring secured to the plunger and urging the plunger; a link connected between the snap-action mechanism and a first side of the loaded member; and a housing enclosing the loaded member, strain sensor, snap-action mechanism, vertical spring, link, and a substantial part of the plunger when the plunger is actuated; wherein the snap-action mechanism puts the loaded member into a first condition when the snap-action mechanism is in the first state, and into a second condition when the snap-action mechanism is in the second state; wherein the strain sensed by the strain sensor when the loaded member is in the first condition is substantially different from the strain sensed by the strain sensor when the loaded member is in the second condition; and wherein the loaded member is secured by one end inside the housing such that there is a clearance between the housing and a second side of the loaded member, wherein the first side of the loaded member is not the same as the second side; at least one controller; and fiber cabling connecting the at least one fiber optic switch to the at least one controller; wherein the at least one switch is mounted to at least one associated surface such that an associated object contacting the at least one switch actuates the plunger.

In accordance with still another aspect of the present invention, a method of using a fiber optic switch includes the steps of a) providing at least one fiber optic switch including a plunger; a loaded member made of a resilient material; a strain sensor mounted on the loaded member to sense strain applied to the loaded member; a snap-action mechanism connected between the plunger and the loaded member, wherein when the plunger is deactuated, the snap-action mechanism is in a first state; wherein actuation of the plunger causes the snap-action mechanism to change rapidly from the first state to a second state; wherein deactuation of the plunger causes the snap-action mechanism to change rapidly from the second state to the first state; and wherein the first state is substantially different from the second state; a fiber optic cable connected to the strain sensor; a vertical spring secured to the plunger and urging the plunger; a link connected between the snap-action mechanism and a first side of the loaded member; and a housing enclosing the loaded member, strain sensor, snap-action mechanism, vertical spring, link, and a substantial part of the plunger when the plunger is actuated; wherein the snap-action mechanism puts the loaded member into a first condition when the snap-action mechanism is in the first state, and into a second condition when the snap-action mechanism is in the second state; wherein the strain sensed by the strain sensor when the loaded member is in the first condition is substantially different from the strain sensed by the strain sensor when the loaded member is in the second condition; and wherein the loaded member is secured by one end inside the housing such that there is a clearance between the housing and a second side of the loaded member, wherein the first side of the loaded member is not the same as the second side; at least one controller; and fiber cabling; b) connecting the fiber cabling between the at least one switch and the at least one controller; c) mounting the at least one switch to at least one associated surface such that an associated object contacting the at least one switch actuates the plunger; and d) the strain sensor transferring a signal corresponding to the strain sensed to the at least one controller to indicate whether the switch is actuated or not.

Still other benefits and advantages of the invention will become apparent to those skilled in the art to which it pertains upon a reading and understanding of the following detailed specification.

III. BRIEF DESCRIPTION OF THE DRAWINGS

The invention may take physical form in certain parts and arrangement of parts, embodiments of which will be described in detail in this specification and illustrated in the accompanying drawings which form a part hereof and wherein.

IV. DETAILED DESCRIPTION OF THE INVENTION

Figure 1:
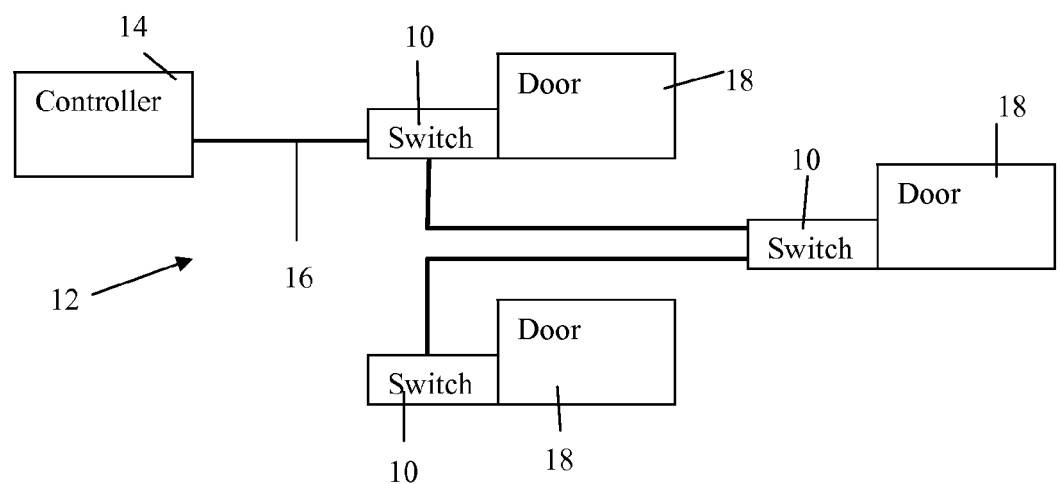
FIG. 1 is a diagram view of a monitoring system.

Referring now to the drawings wherein the showings are for purposes of illustrating embodiments of the invention only and not for purposes of limiting the same, and wherein like reference numerals are understood to refer to like components, FIG. 1 shows a fiber optic switch 10 in one application: a monitoring system 12. Such a system 12 may monitor whether doors 18 are open or closed. In various alternative embodiments, the system 12 may monitor manhole covers, hatches, panels, windows, other position-sensitive locking devices, and other physical objects that move. The system 12 may include at least one controller 14, at least one switch 10, at least one associated door 18, and interconnecting fiber cable 16 to interconnect any controllers 14 and any switches 10. At least one switch 10 is installed at the associated door 18. More than one switch 10 may be installed per door 18 for redundancy purposes. When the door 18 is closed, the switch 10, which is contacted by the door 18, may return a first signal to the controller 14. When the door 18 is opened, the switch 10, which now is not contacted by the door 18, may return a second signal, different from the first, to the controller 14.

Figure 2:
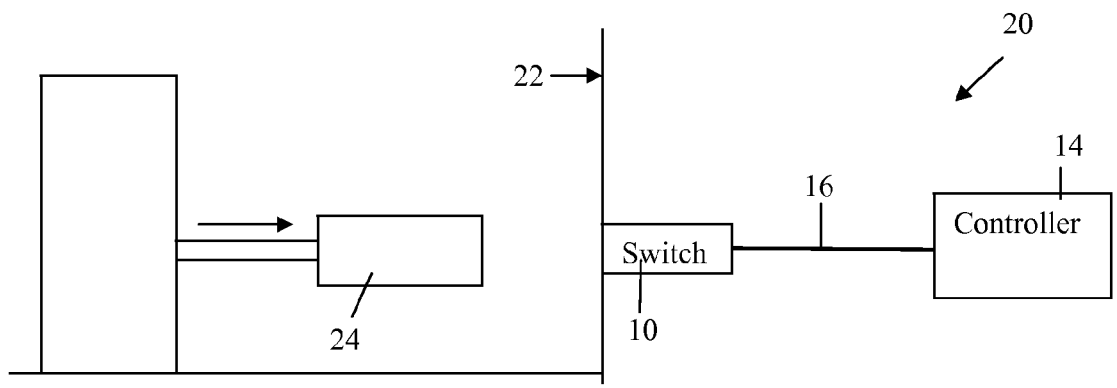
FIG. 2 is a diagram view of a proximity-sensing system.

FIG. 2 shows the fiber switch 10 in a second application: a proximity sensing system 20. Such a system 20 may monitor whether a traveling object 24 has reached the end of its desired travel distance. In alternative embodiments, the system 20 may determine whether a surface 22 on which the switch 10 is installed has been contacted by any physical object 24. In another embodiment, the switch 10 may be used in a motion control system 20. This system may include at least one controller 14, at least one switch 10, an associated surface 22 on which the switch is installed, at least one associated traveling object 24, and interconnecting fiber cable 16 to interconnect any controllers 14 and any switches 10. A switch 10 may be installed on an associated surface 22. When the traveling object 24 travels towards the associated surface 22 but has not yet touched it 22, the switch 10 may return a first signal to the controller 14. When the traveling object 24 reaches the associated surface 22 and first contacts the switch 10, the switch 10 may return a second signal, different from the first, to the controller 14, indicating that the object 24 has reached the end of its desired travel distance.

Figure 3:
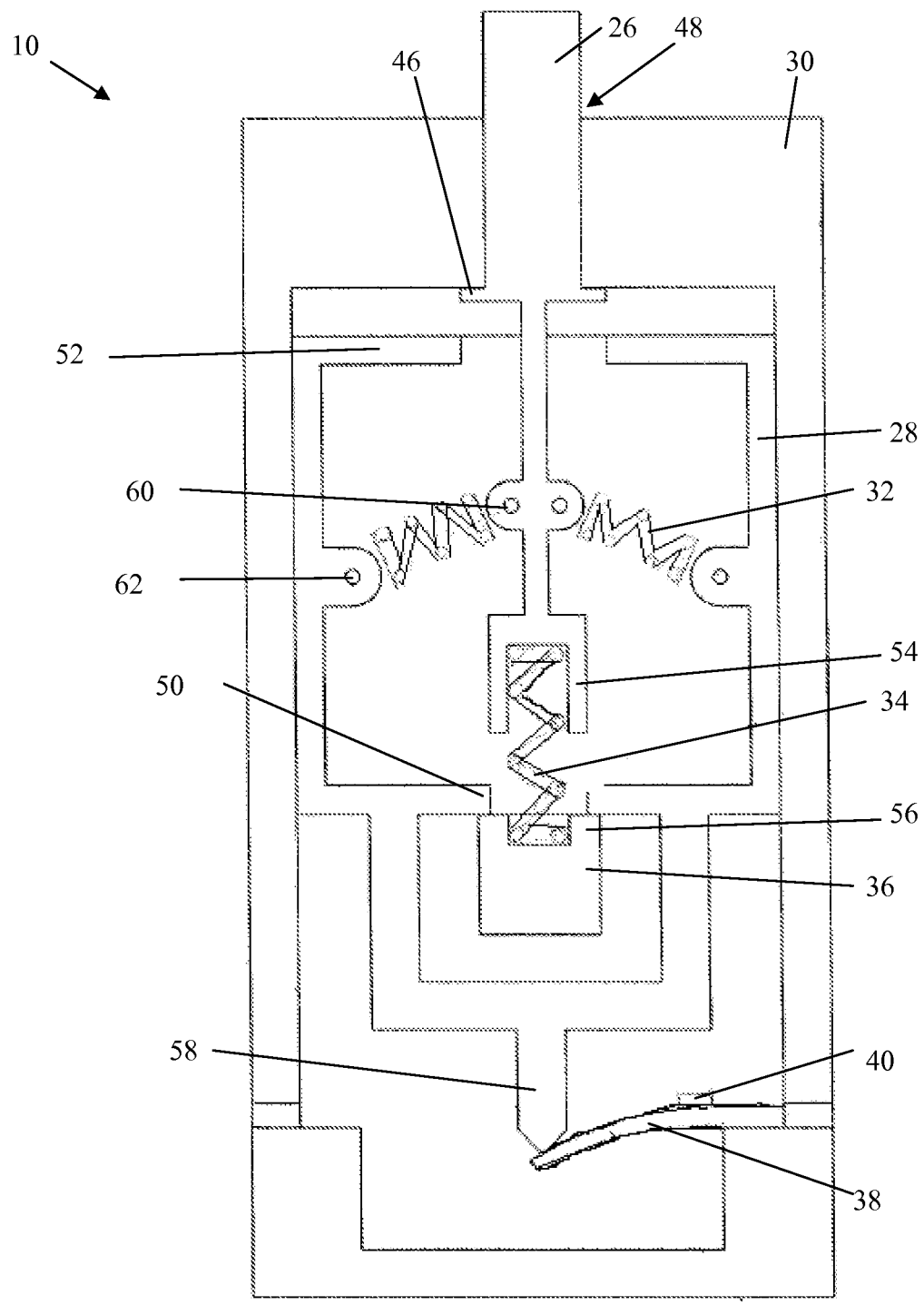
FIG. 3 is a side cutaway view of one embodiment of a deactuated fiber optic switch.

FIG. 3 shows a side cutaway view of a fiber optic switch 10 with the plunger 26 deactuated. The switch 10 may include a housing 30 that encloses the switch 10 components. The switch 10 may include a plunger 26, which may protrude outside the housing 30. The plunger 26 may have at least one flange 46 that is greater than the plunger opening 48 in the housing 30 thereby preventing the plunger 26 from fully exiting the housing 30. The plunger 26 may be urged out of the housing 30 by a vertical spring 34, which pushes off of a spring support block 36. The spring support block 36 may be fixed relative to the housing 30 and may limit the movement of the plunger 26 into the switch 10 when actuated. The spring 34 may keep an unloaded plunger 26 in a deactuated state. The spring may be held in place by at least one spring flange 54 in the plunger 26 and at least one spring flange 56 in the spring support block 36.

The switch 10 may also include a snap-action or an over-center mechanism 28. This mechanism 28 may be movable vertically relative to the housing 30 but may be sized to not move horizontally relative to the housing 30. The mechanism 28 may include at least one flange 50 that overlaps at least a portion of the spring support block 36. This overlap may prevent the mechanism 28 from moving too far downwards when the plunger 26 is deactuated. The mechanism flange 50 may be arranged in a way to allow the vertical spring 34 and plunger 26 to move without direct interference by the flange 50. The mechanism 28 may include at least one upper flange 52, which may contact the housing 30 when the switch 10 is actuated. The over-center mechanism 28 may include at least one horizontal spring 32 that is connected to the plunger 26. In another embodiment, two horizontal springs 32 are connected from the plunger 26 to the mechanism 28 on opposite sides of the plunger 26. The over-center mechanism 28 may also include a link 58. In one embodiment, the link 58 is centered along the vertical axis of actuation of the plunger 26. In another embodiment, the mechanism 28 may include a ramp in contact with a loaded member 38, the ramp having a sufficiently-steep angle to create a rapidly-changing strain level in the loaded member 38.

The switch 10 may also include a loaded member 38. The loaded member 38 may be secured to the housing 30 such that there is clearance below the loaded member 38 opposite from the side where the link 58 is located. In one embodiment, the loaded member 38 is elongated in shape and is secured to the housing 30 at only one end. In alternative embodiments, the loaded member 38 may have square, rectangular, circular, or tubular cross-sections. The loaded member 38 may be made from any suitable resilient or elastic material that will bend when a force is applied to it and will return to its original state when the force is removed. The switch 10 may include a strain sensor 40 secured to the loaded member 38. In one embodiment, the sensor 40 may be a fiber Bragg grating sensor. In another embodiment, the sensor 40 may be a section of optical fiber that measures the strain by opto-elastic effects of the optical fiber.

Figure 4:
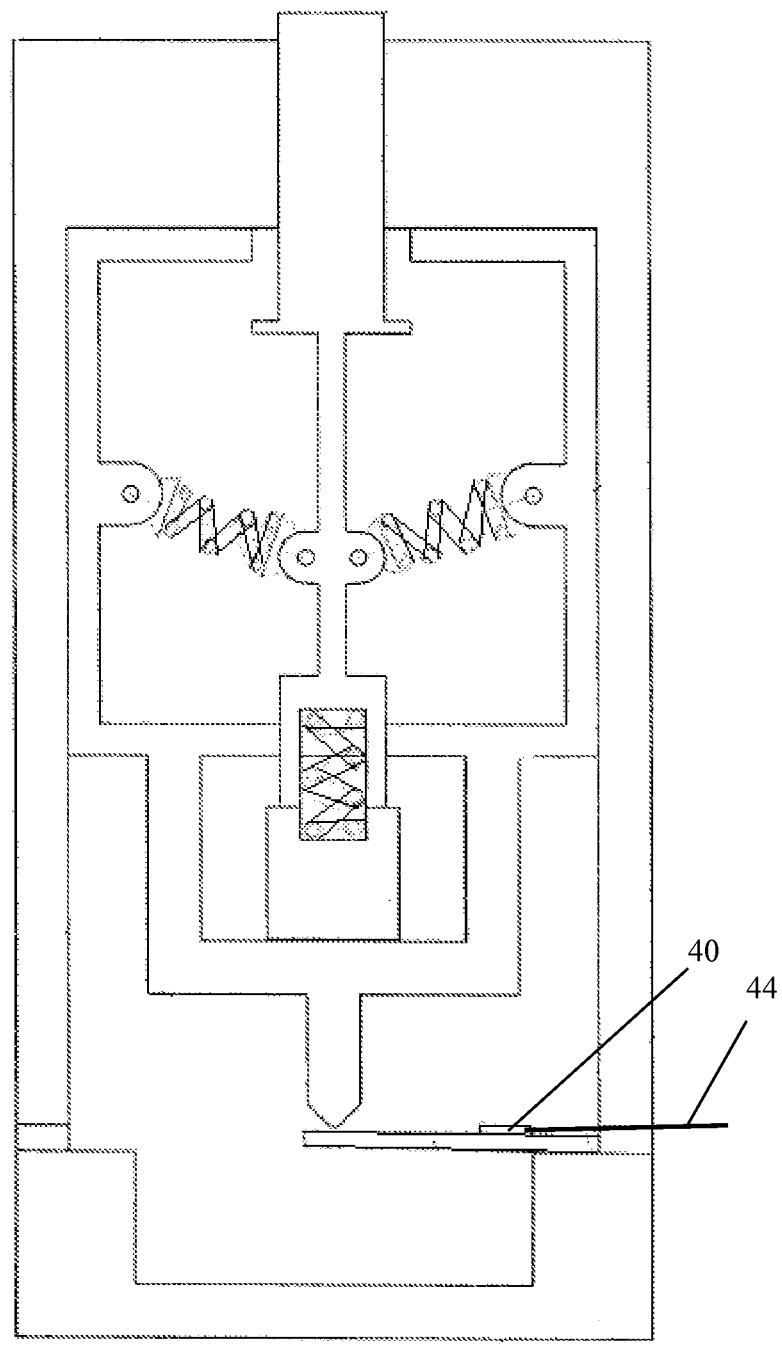
FIG. 4 is a side cutaway view of one embodiment of an actuated fiber optic switch.

With reference to FIGS. 3-4, the operation of the switch 10 will now be described. When the switch 10 is in a deactuated state, as in FIG. 3, no external force is applied to the plunger 26. The vertical spring 34 may push off of the fixed spring support block 36 and urge the plunger 26 vertically upwards, out of the switch housing 30. The at least one plunger flange 46 prevents the plunger 26 from fully exiting the housing 30. The over-center mechanism 28 has a limited range of vertical motion because the housing 30 limits its upper movement and the mechanism flange 50 and spring support block 36 limit its lower movement. As the plunger 26 moves upwards, the point 60 at which the horizontal springs 32 attach to the plunger 26 moves past and above the point 62 at which the horizontal springs 32 attach to the mechanism 28. The springs 32 may apply an angled force along the direction from point 60 to point 62. This force may have a horizontal component that will not matter because the mechanism 28 is limited from moving horizontally. This force may also have a vertical component that may move or snap the mechanism 28 to its lower limit. As the mechanism 28 moves downwards, the link 58 may press against the loaded member 38, stressing it 38. The mechanism 28 is mechanically coupled through the link 58 to the loaded member 38. The strain sensor 40 may sense the high strain on the loaded member 38 and may generate a corresponding signal that the switch 10 is in one state. By selecting the size and placement of the spring support block 36, the mechanism flange 50, and the link 58, the maximum strain applied to the loaded member 38 can be controlled.

When an external force is applied to the plunger 26, for example by an object 24 or a door 18, as in FIG. 4, the plunger 26 moves downward vertically, compressing the vertical spring 34, until it 26 is stopped by the spring support block 36. As the plunger 26 moves downwards, initially the horizontal springs 32 apply an angled downward force to the over-center mechanism 28, as described above. However, as the plunger 26 keeps moving downwards, its spring-connection point 60 may horizontally meet and then pass the spring-connection point 62 of the mechanism 28 because the plunger 26 has a greater range of vertical motion. When point 60 becomes lower than point 62, the angled force may now have a vertical component in the opposite direction than before, thus snapping and moving the mechanism 28 upwards. As the mechanism 28 moves upwards, the link 58 may also move upwards and remove the force from the loaded member 38. The strain sensor 40 may sense the reduced strain on the loaded member 38 and may generate a corresponding signal that the switch 10 is in the other state.

The switch 10 determines the state it 10 is in by measuring the strain on the loaded member 38. The over-center or snap-action mechanism 28 is used to create a distinct difference in the loaded and unloaded (on/off, open/closed) states of the loaded member 38. By appropriately designing the distance that the loaded member 38 moves in the two states, the strain sensor 40 can generate very discretely-different signals. The strain levels may be designed to be much greater than those potentially caused by any thermal effects, thus reducing any false readings by the switch 10 due to thermal effects. In an alternative embodiment, the switch components may be arranged so that a deactuated switch 10 will result in low strain on the loaded member 38, whereas an actuated switch 10 will result in high strain on the loaded member 38.

The switch 10 may include at least one fiber cable 44 that has one end connected to the strain sensor 40. The second end of the fiber cable 44 may include a terminal connector for connection to another component. The fiber cable 44 may be short, such as several inches, or long, such as approximately 50 miles. Lengths in between, such as several hundred yards, are also included. The length of the fiber cable 44 may be limited to the point that attenuation prevents operation. In an alternative embodiment, the switch 10 may be provided with a terminal that an interconnecting fiber cable 16 may connect to.

Figure 5:
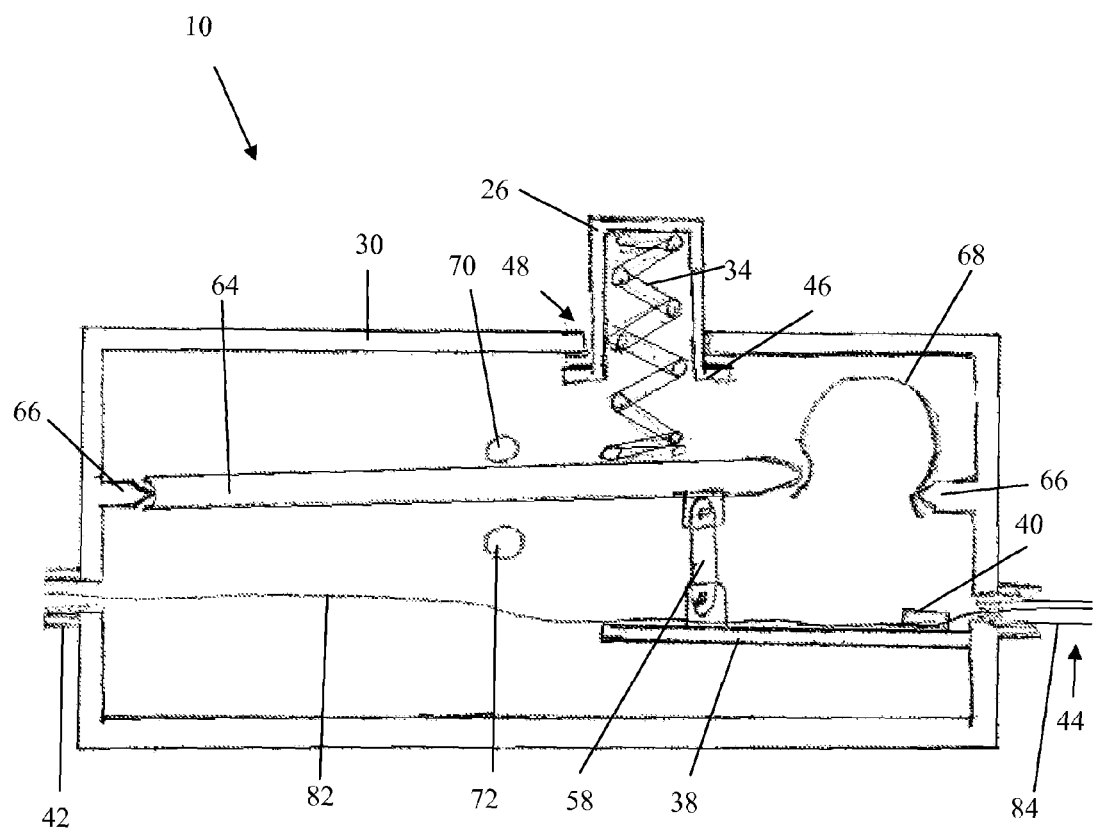
FIG. 5 is a side cutaway view of another embodiment of a deactuated fiber optic switch.
Figure 6:
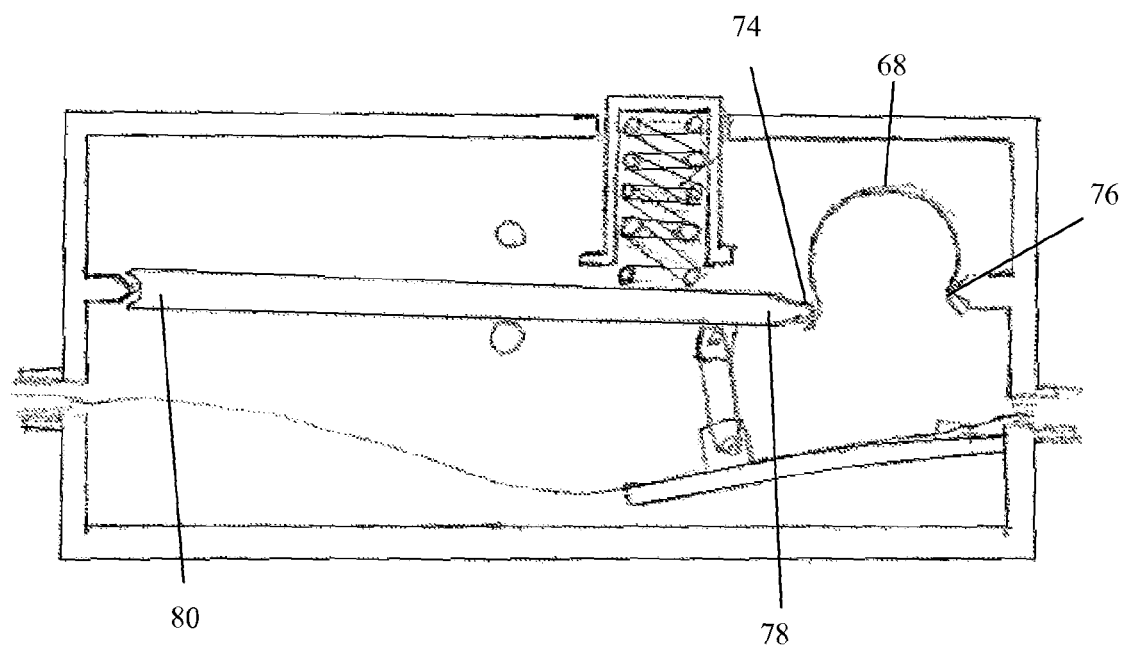
FIG. 6 is a side cutaway view of another embodiment of an actuated fiber optic switch.

FIG. 5 shows a cutaway view of another embodiment. This switch 10 may also include a housing 30 that encloses internal components and a plunger 26 that activates the switch 10. The plunger 26 may be urged out of the housing 30 by a vertical spring 34. The plunger 26 may have at least one flange 46 that is greater than the plunger opening 48 in the housing 30 thereby preventing the plunger 26 from fully exiting the housing 30. The spring 34 may push off of a lever 64. As shown in FIG. 6, the lever 64 may be held at one end 80 by a bearing 66 and at the other end 78 by one connection point 74 of a snap-action spring 68. The other connection point 76 of the snap-action spring 68 may be held by a bearing 66. This configuration of bearings 66, lever 64, and spring 68 may allow the lever 64 some vertical movement but substantially no horizontal movement. An upper stop 70 and a lower stop 72 may limit the vertical movement of the lever 64. The lever 64 may be connected to a link 58, which may be connected to a loaded member 38. The connections between the link 58 and the lever 64 and loaded member 38 may, in an alternative embodiment, be pivot connections. The loaded member 38 may be secured to the housing 30 such that there is clearance below the loaded member 38 opposite from the side where the link 58 is located. A strain sensor 40 may be secured to the loaded member 38. A fiber cable 44 may be connected to the strain sensor 40. The fiber cable 44 may include a fiber 82 and a fiber jacket 84 that covers and surrounds the fiber 82. The fiber cable 44 may be a rugged cable that includes a stainless steel spiral tubing with a molded shield for environmental protection. The cable 44 may also include strength fibers. A strain relief 42 may be provided in the housing 30 for the cable 44.

With reference to FIGS. 5 and 6, the operation of this embodiment of the switch 10 will now be described. FIG. 5 shows the switch 10 deactuated, and FIG. 6 shows the switch 10 actuated. Whenever the resilient loaded member 38 is forced to a state other than neutral, the member 38 may exert some counterforce in an attempt to return to its neutral state. For example, in FIG. 5, the neutral state of the loaded member 38 is substantially horizontal, as shown. This counterforce supports the link 58 and applies an upward force through the link 58 to the lever 64. The link 58 is sized such that the loaded member 38 in its neutral state pushes the lever 64 such that the lever's one end 78 is higher than the lever's other end 80. The snap-action spring 68 is designed and secured such that its one connection point 74 generally may be either above or below its other connection point 76; as a practical matter, the two connection points 74, 76 of the spring 68 will not be on the same horizontal level in operation.

With no external force applied to the plunger 26, the link 58 and snap-action spring 68 may urge the lever 64 upward. The vertical spring 34 may push off the lever 64 and urge the plunger 26 upwards. When the plunger flange 46 reaches the housing, the plunger 26 may push back on the spring 34, thus exerting a counterforce on the lever 64. However, this counterforce is insufficient to overcome the force keeping the one connection point 74 of the snap-action spring 68 higher than its other connection point 76, and the counterforce is insufficient to deform the loaded member 38 from its neutral position. The strain sensor 40 may sense a low strain on the loaded member 38 and may generate a corresponding signal that the switch 10 is in a first state.

When an external force is applied to the plunger 26 as in FIG. 6, the vertical spring 34 may become more compressed, thus exerting a greater force downwards on the lever 64. When this downward force overcomes the counterforce exerted on the lever 64 by the link 58 and the snap-action spring 68, the snap-action spring 68 may change its position so that the one connection point 74 now becomes lower than its other connection point 76. This change may occur in a fast, over-center manner. At this point, the one end 78 of the lever 64 may become lower than the other end 80 of the lever 64. The lever 64 may now apply a force, through the link 58, on the loaded member 38, stressing it 38. The strain sensor 40 may now sense a high strain on the loaded member 38 and may generate a corresponding signal that the switch 10 is in a second state. By selecting the size, configuration, and placement of the upper and lower stops 70, 72, snap-action spring 68, and link 58, the maximum strain applied to the loaded member 38 can be controlled.

The switch 10 components may be constructed from any material suitable for the application, including, but not limited to, metal, steel, iron, copper, aluminum, polymer, mylar film, fiber glass composite, ceramic, and composite materials. The switch 10 may be of any desired size. In one embodiment, the switch 10 may measure substantially 1 inch by 1 inch by ¼ inches. In another embodiment, the switch 10 may be a cube with each dimension measuring substantially 1 inch.

The switch 10 may be mounted by any known mounting means. In one embodiment, adhesive may be used to secure the switch 10 to a surface 22. In another embodiment, the switch 10 may include mounting holes through which a bolt or screw may secure the switch 10 to a surface 22.

In alternative applications, the switch 10 may be used wherever a discrete-state (on-off) switch or sensor is desired. The switch 10 may be constructed, as described above, to be immune to electromagnetic interferences. Also, no sparks or arcs are generated with the switch's operation. The switch 10 may therefore be used in environments where intrinsically-safe components are desired, such as explosive or flammable environments. The switch 10 may also be used in mining; under water; and in industrial applications such as refineries, petroleum processes, and chemical processes. The switch 10 may also be used in medical applications. For example, by constructing the switch 10 from either non-metallic or non-ferrous materials, the switch 10 may be used in magnetic resonance imaging (MRI) applications. Because the switch 10 is not affected by ionizing radiation, the switch 10 may be used in nuclear applications. The switch 10 may also be used in military or security applications.

Because the switch 10 is a fiber optic switch, it 10 may be connected on long runs of fiber cable 16. As mentioned previously, more than one switch 10 may be connected to one fiber cable 16. These switches 10 may be connected in series. In another embodiment, the switches 10 may also be connected in parallel via splitters. In yet another embodiment, the switches 10 may be connected in a drop/add configuration. In one embodiment, up to 50 switches 10 may be connected to one fiber cable 16. In another embodiment, fiber Bragg grating sensors 40 may be used in the switches 10 to identify which switch 10 has been actuated regardless of the order in which the switches 10 are connected to a controller 14. In another application, the switch 10 may be connected through a converter to a non-fiber-optic electromagnetic circuit.

Numerous embodiments have been described, hereinabove. It will be apparent to those skilled in the art that the above methods and apparatuses may incorporate changes and modifications without departing from the general scope of this invention. It is intended to include all such modifications and alterations in so far as they come within the scope of the appended claims or the equivalents thereof.

Having thus described the invention, it is now claimed:

We claim:

1. A fiber optic switch comprising:
   a plunger;
   a loaded member;
   a strain sensor mounted on the loaded member to sense strain applied to the loaded member;
   a snap-action mechanism connected between the plunger and the loaded member, wherein when the plunger is deactuated, the snap-action mechanism is in a first state; wherein actuation of the plunger causes the snap-action mechanism to change rapidly from the first state to a second state; wherein deactuation of the plunger causes the snap-action mechanism to change rapidly from the second state to the first state; and wherein the first state is substantially different from the second state; and
   a housing enclosing the loaded member, strain sensor, snap-action mechanism, and a substantial part of the plunger when the plunger is actuated;
   wherein the snap-action mechanism puts the loaded member into a first condition when the snap-action mechanism is in the first state, and into a second condition when the snap-action mechanism is in the second state; and
   wherein the strain sensed by the strain sensor when the loaded member is in the first condition is substantially different from the strain sensed by the strain sensor when the loaded member is in the second condition.

2. The fiber optic switch of claim 1 further comprising:
   a fiber optic cable connected to the strain sensor;
   a vertical spring secured to the plunger and urging the plunger; and
   a link connected between the snap-action mechanism and a first side of the loaded member;
   wherein the loaded member is secured by one end inside the housing such that there is a clearance between the housing and a second side of the loaded member, wherein the first side of the loaded member is not the same as the second side.

3. The fiber optic switch of claim 2 wherein the loaded member is made of a resilient material, and either 1) exhibits high strain when it is in the first condition and low strain when it is in the second condition, or 2) exhibits low strain when it is in the first condition and high strain when it is in the second condition.

4. The fiber optic switch of claim 3 wherein:
   the snap-action mechanism comprises at least one spring connected to the plunger; and
   the snap-action mechanism moves substantially in only one of the three dimensions of length, width, and depth.

5. The fiber optic switch of claim 4 further comprising:
   a support block;
   wherein a first end of the vertical spring is connected to the plunger and a second end of the vertical spring is connected to the support block; and
   wherein the support block limits the movement of the snap-action mechanism along its dimension of movement to a predetermined range.

6. The fiber optic switch of claim 3 further comprising:
   a lever; and
   at least two bearings;

wherein the snap-action mechanism is a snap-action spring;
wherein a first end of the lever is connected to one bearing and a second end of the lever is connected to a first end of the snap-action spring;
wherein a second end of the snap-action spring is connected to another bearing; and
wherein the link is pivotally connected at one end to the lever and pivotally connected at another end to the loaded member.

7. The fiber optic switch of claim 3 wherein:
the strain sensor is a fiber Bragg grating sensor; and
the cross-section of the loaded member, looking along an axis along which the loaded member is secured to the housing, is one of:
square;
rectangular;
circular; and
tubular.

8. The fiber optic switch of claim 7 wherein all components of the switch are made from non-metallic or non-ferrous materials.

9. The fiber optic switch of claim 3 wherein the fiber optic cable comprises:
an optical fiber;
at least one strength fiber;
a stainless steel spiral tubing around the fibers; and
a molded shield around the stainless steel spiral tubing.

10. The fiber optic switch of claim 1 further comprising a fiber optic terminal.

11. A system for sensing actuation comprising:
at least one fiber optic switch, comprising:
a plunger;
a loaded member made of a resilient material;
a strain sensor mounted on the loaded member to sense strain applied to the loaded member;
a snap-action mechanism connected between the plunger and the loaded member, wherein when the plunger is deactuated, the snap-action mechanism is in a first state; wherein actuation of the plunger causes the snap-action mechanism to change rapidly from the first state to a second state; wherein deactuation of the plunger causes the snap-action mechanism to change rapidly from the second state to the first state; and wherein the first state is substantially different from the second state;
a fiber optic cable connected to the strain sensor;
a vertical spring secured to the plunger and urging the plunger;
a link connected between the snap-action mechanism and a first side of the loaded member; and
a housing enclosing the loaded member, strain sensor, snap-action mechanism, vertical spring, link, and a substantial part of the plunger when the plunger is actuated;
wherein the snap-action mechanism puts the loaded member into a first condition when the snap-action mechanism is in the first state, and into a second condition when the snap-action mechanism is in the second state;
wherein the strain sensed by the strain sensor when the loaded member is in the first condition is substantially different from the strain sensed by the strain sensor when the loaded member is in the second condition; and
wherein the loaded member is secured by one end inside the housing such that there is a clearance between the housing and a second side of the loaded member, wherein the first side of the loaded member is not the same as the second side;
at least one controller; and
fiber cabling connecting the at least one fiber optic switch to the at least one controller;
wherein the at least one switch is mounted to at least one associated surface such that an associated object contacting the at least one switch actuates the plunger.

12. The system of claim 11 wherein the at least one associated surface and object comprise an associated cover and associated frame such that either 1) the associated cover being closed actuates the plunger and the associated cover being open deactuates the plunger, or 2) the associated cover being open actuates the plunger and the associated cover being closed deactuates the plunger.

13. The system of claim 11 comprising at least two fiber optic switches;
wherein the at least two fiber optic switches are connected by fiber cabling in a manner chosen from the group consisting of:
serial connection;
parallel connection via splitters; and
drop/add configuration.

14. The system of claim 13 wherein the length of the fiber cabling interconnecting the fiber optic switches and at least one controller is chosen from the group consisting of:
between 1 inch and 10 feet;
between 2 inches and 100 yards;
between 2 feet and 100 yards;
between 100 yards and 1 mile;
between 100 yards and 10 miles;
between 1 mile and 50 miles; and
between 1 inch and 50 miles.

15. A method of using a fiber optic switch, comprising the steps of:
a) providing:
at least one fiber optic switch comprising:
a plunger;
a loaded member made of a resilient material;
a strain sensor mounted on the loaded member to sense strain applied to the loaded member;
a snap-action mechanism connected between the plunger and the loaded member, wherein when the plunger is deactuated, the snap-action mechanism is in a first state; wherein actuation of the plunger causes the snap-action mechanism to change rapidly from the first state to a second state; wherein deactuation of the plunger causes the snap-action mechanism to change rapidly from the second state to the first state; and wherein the first state is substantially different from the second state;
a fiber optic cable connected to the strain sensor;
a vertical spring secured to the plunger and urging the plunger;
a link connected between the snap-action mechanism and a first side of the loaded member; and
a housing enclosing the loaded member, strain sensor, snap-action mechanism, vertical spring, link, and a substantial part of the plunger when the plunger is actuated;
wherein the snap-action mechanism puts the loaded member into a first condition when the snap-action mechanism is in the first state, and into a second condition when the snap-action mechanism is in the second state;

wherein the strain sensed by the strain sensor when the loaded member is in the first condition is substantially different from the strain sensed by the strain sensor when the loaded member is in the second condition; and wherein the loaded member is secured by one end inside the housing such that there is a clearance between the housing and a second side of the loaded member, wherein the first side of the loaded member is not the same as the second side;

at least one controller; and fiber cabling;

b) connecting the fiber cabling between the at least one switch and the at least one controller;

c) mounting the at least one switch to at least one associated surface such that an associated object contacting the at least one switch actuates the plunger; and d) the strain sensor transferring a signal corresponding to the strain sensed to the at least one controller to indicate whether the switch is actuated or not.

16. The method of claim 15 wherein:

the associated surface and object of step c) comprise an associated cover or door and associated frame;

the indication of step d) determines whether the associated cover or door is open or closed.

17. The method of claim 15 wherein the indication of step d) when the switch is actuated indicates that the associated object has reached an end of its travel distance.

18. The method of claim 15 wherein the mounting of step c) is in an environment chosen from the group consisting of:

hazardous;
flammable;
explosive;
underwater;
nuclear;
military;
medical;
industrial;
chemical;
mining; and
petroleum.

19. The method of claim 18 wherein:

in step a), all components of the at least one switch are made from non-metallic or non-ferrous materials; and the at least one switch is mounted in step c) in a magnetic resonance imaging environment.

20. The method of claim 15 wherein:

step a) further comprises providing at least two fiber optic switches;

step b) further comprises connecting the at least two switches in a manner chosen from the group consisting of:

serial connection;

parallel connection via splitters; and drop/add configuration;

step c) further comprises mounting the at least two switches to different associated surfaces; and the controller determining in step d) which of the at least two switches was actuated if at least one switch was actuated.

* * * * *